(12) United States Patent
Tanase et al.

(10) Patent No.: US 9,985,633 B1
(45) Date of Patent: May 29, 2018

(54) SYSTEMS, METHODS AND APPARATUS FOR VOLTAGE CLAMPING

(71) Applicant: Maxim Integrated Products, Inc., San Jose, CA (US)

(72) Inventors: Gabriel E. Tanase, Cupertino, CA (US); Michael B. Francon, Los Gatos, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days. days.

(21) Appl. No.: 15/263,201

(22) Filed: Sep. 12, 2016

Related U.S. Application Data

(62) Division of application No. 14/473,994, filed on Aug. 29, 2014, now Pat. No. 9,444,434.

(60) Provisional application No. 61/986,872, filed on Apr. 30, 2014.

(51) Int. Cl.
*H03K 5/08* (2006.01)
*H03K 19/018* (2006.01)

(52) U.S. Cl.
CPC ......... *H03K 19/01806* (2013.01); *H03K 5/08* (2013.01)

(58) Field of Classification Search
CPC .............................................. H03K 19/01806
See application file for complete search history.

(56) References Cited

U.S. PATENT DOCUMENTS 5,170,134 A * 12/1992 Bien .................... H03F 3/3076
330/255
2014/0084962 A1 3/2014 Schuler

OTHER PUBLICATIONS

"CLC502 Clamping, Low Gain Op Amp with Fast 14-bit Settling," Lit. No. SNOS859B, Texas Instruments Tech. Spec. Sheet, National Semiconductor Corp., Jan. 2001, pp. 1-12.
"MAX44205—180MHz, Low-Noise, Low-Distortion, Fully Differential Op Amp/SAR ADC Driver," Technical Specification Sheet, MAXIM Intergrated, Jun. 2014, Rev. 0, pp. 1-29.

* cited by examiner

*Primary Examiner* — Daniel Puentes
(74) *Attorney, Agent, or Firm* — TIPS Group

(57) ABSTRACT

A voltage clamping system includes: (a) a first electronic device connected to a first power source and having a signal output node, a voltage clamp high node, and a voltage clamp low node, wherein the voltage clamp high node and the voltage clamp low node are coupled to a second power source different than the first power source; and (b) a second electronic device powered by the second power source and having a signal input node coupled to the signal output node of the first electronic device. The signal output node of the first electronic device is passively clamped, with low distortion, approximately rail-to-rail with respect to the second power source such that the second electronic device is protected from damage due to excessive voltage levels.

17 Claims, 2 Drawing Sheets

SYSTEMS, METHODS AND APPARATUS FOR VOLTAGE CLAMPING

CROSS REFERENCE TO RELATED APPLICATION(S)

This is a divisional application of U.S. Ser. No. 14/473,994, filed Aug. 29, 2014, now U.S. Pat. No. 9,444,434, which claims the benefit of U.S. Provisional Patent Application No. 61/986,872, filed Apr. 30, 2014, both of which are incorporated herein by reference.

BACKGROUND

Operational amplifiers (OpAmps) in industrial and other high-voltage settings often operate at relatively high voltage levels, e.g. 15 VDC. Digital devices such as analog-to-digital converters (ADCs), however, typically operate at lower voltage levels, e.g. 3.3 VDC. This is problematical in that if the voltage of the output signal of the OpAmp is too high (e.g. 5-15 VDC) it can damage the electrostatic discharge (ESD) protection diode or other circuitry of the ADC.

Clamping circuits have been used to limit the output signals of OpAmps ("driver") such so that they do not damage the ADCs or other low-voltage devices. Since the best performance of high-resolution ADC(s) (16 bits to 20 bits) is achieved when the input signal swings fully from rail to rail (e.g. from the positive power supply to the negative power supply of the ADC), the clamping circuits of the driver should be accurate, linear and low in noise. This has required relatively complex circuitry including feedback loops and feedback stabilization techniques in the past. In general, the driver performance (SNR+D) must be superior (>10 dB) to the ADC's, such that system performance is, for all practical purposes, limited by ADC only.

An example operational amplifier with clamping was manufactured by National Semiconductor of Santa Clara, Calif. (now a division of Texas Instruments, Inc. of Dallas Tex.) as part number CLC502. The CLC502 is an operational amplifier designed for low gain applications requiring output voltage clamping. This feature was accomplished by the use of a feedback loop including a number of external components to the OpAmp. As a result, the CLC502 is relatively expensive and complicated to implement due to the number and cost of the required external components to stabilize its feedback loop.

These and other limitations of the prior art will become apparent to those of skill in the art upon a reading of the following descriptions and a study of the several figures of the drawing.

SUMMARY

In an embodiment, set forth by way of example and not limitation, a voltage clamping apparatus includes: (a) a predriver having a signal input node, a output high node and a output low node; (b) a first current source coupled between a first voltage source node and the output high node; (c) a second current source coupled between a second voltage source node and the output low node; (d) a first transistor having a control node coupled to the output high node and a first active node coupled to a signal output node; (e) a second transistor having a control node coupled to the output low node and a first active node coupled to the signal output node; (f) a first level shifter coupling a first node of a first low voltage-drop diode to the output high node, whereby a second node of the first low voltage-drop diode comprises a voltage clamp high node; and (g) a second level shifter coupling a first node of a second low voltage-drop diode to the output low node, whereby a second node of the second low voltage-drop diode comprises a voltage clamp low node.

In an embodiment, set forth by way of example and not limitation, a voltage clamping system includes: (a) a first electronic device connected to a first power source and having a signal output node, a voltage clamp high node, and a voltage clamp low node, wherein the voltage clamp high node and the voltage clamp low node are coupled to a second power source different than the first power source; and (b) a second electronic device powered by the second power source and having a signal input node coupled to the signal output node of the first electronic device.

In an embodiment, set forth by way of example and not limitation, a method for voltage clamping includes: (a) drawing current from a first current source of a diamond-type output stage with a first series connection of a first level shifter and a first Schottky diode coupled to a first rail of a power supply; and (b) drawing current from a second current source of the diamond-type output stage with a second series connection of a second level shifter and a second Schottky diode coupled to a second rail of a power supply, whereby an output signal from the diamond-type output stage is limited by the first rail and the second rail.

In an embodiment, set forth by way of example and not limitation, a voltage clamping stage and system include a first device, such as an OpAmp, which develops a voltage clamped output signal OUT for a second device, such as an ADC. The OpAmp has an output stage which limits the signal OUT in the range of [VCLPL−Δ]≤OUT≤[VCLPH+Δ], where VCLPH is the positive voltage supply for the ADC, and VCLPL is the negative voltage supply for the ADC. In a non-limiting embodiment, Schottky diodes are used to provide the Δ voltage.

In another embodiment, set forth by way of example and not limitation, a voltage clamping stage includes a "diamond-type" output circuit and an emitter-follower (or source-follower) circuit including Schottky diodes which clamps a signal OUT in the range of [VCLPL−Δ]≤OUT≤[VCLPH+Δ], where VCLPH is the positive voltage supply for the ADC, and VCLPL is the negative voltage supply for the ADC. In a non-limiting embodiment, Schottky diodes are used to provide the Δ voltage. In certain example embodiments, the output voltages are clamped when the signal OUT exceed the ADC's rails to limit the current through the Schottky diodes.

An advantage of embodiments as set forth herein is that a device, such as an OpAmp, provides an OUT signal that exceeds that of the power supply of the ADC by Δ, such that the OUT signal provides for the true rail-to-rail, low-distortion operation of the ADC.

Another is that high-resolution ADC drivers can achieve low-power, low-distortion and true rail-to-rail operation.

Embodiments as set forth herein are advantageous in that they are simple and very fast. This is due, at least in part, to a lack of a feedback loop and the circuitry to stabilize such a loop.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
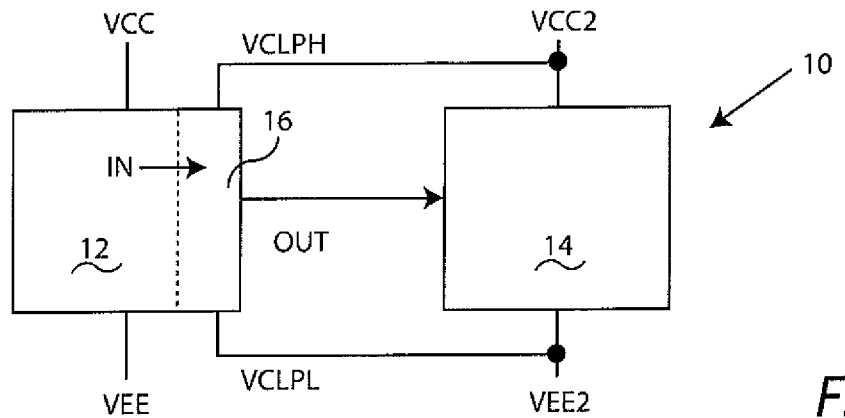
FIG. 1 is a block diagram of an example voltage clamping system including a voltage clamping apparatus.

FIG. 1 is a block diagram of an embodiment, set forth by way of example and not limitation, of a voltage system 10. In this non-limiting example, a first electronic device 12 provides a signal OUT to a second electronic device 14. In this example embodiment, device 12 is powered by a positive power supply VCC and a negative power supply VEE, while device 14 is powered by a positive power supply VCC2 and a negative power supply VEE2. By way of a first non-limiting example, device 12 can be powered by direct current (DC) split-supplies providing VCC at, for example, 5 volts DC. (VDC) and VEE at, for example, −5 VDC. By way of a second non-limiting example, device 12 can be an operational amplifier (OpAmp) can be powered by a 15 VDC power supply and device 14 can be an analog-to-digital converter (ADC) powered by a 3.3 VDC power supply, That is, in this second example embodiment, VCC=15 VDC, VCC2=3.3 VDC, and VEE=VEE2=0.0 VDC (ground). Such voltages can be provided by a multi-level DC power supply, as well known to those of skill in the art.

In the example embodiment of FIG. 1, device 12 is provided with an integrated voltage clamping stage 16 which is designed to keep voltage levels (both positive and negative) of the signal OUT within a range that will not damage the device 14, which operates at much lower voltages. As will be discussed in greater detail subsequently, this is accomplished by "clamping" the voltage range for the signal OUT between an upper clamping voltage VCLPH ("voltage clamp high") node and a lower clamping voltage VCLPL ("voltage clamp low") node. In the non-limiting example embodiment of FIG. 1, VCLPH=VCC2 and VCLPL=VEE2.

By way of non-limiting example, an OpAmp device 12 develops an amplified signal IN that is applied to output stage 16 of device 12. The signal IN can range between VCC and VEE. If the signal OUT that is produced by the OpAmp were directly applied to the input of ADC device 14, may, for example, operate with a 3.3 VDC power supply, the device might be damaged. However, the output stage 16 is operative to clamp the voltage range for OUT from about 0-3.3 VDC, protecting the device 14 from damage.

Figure 2:
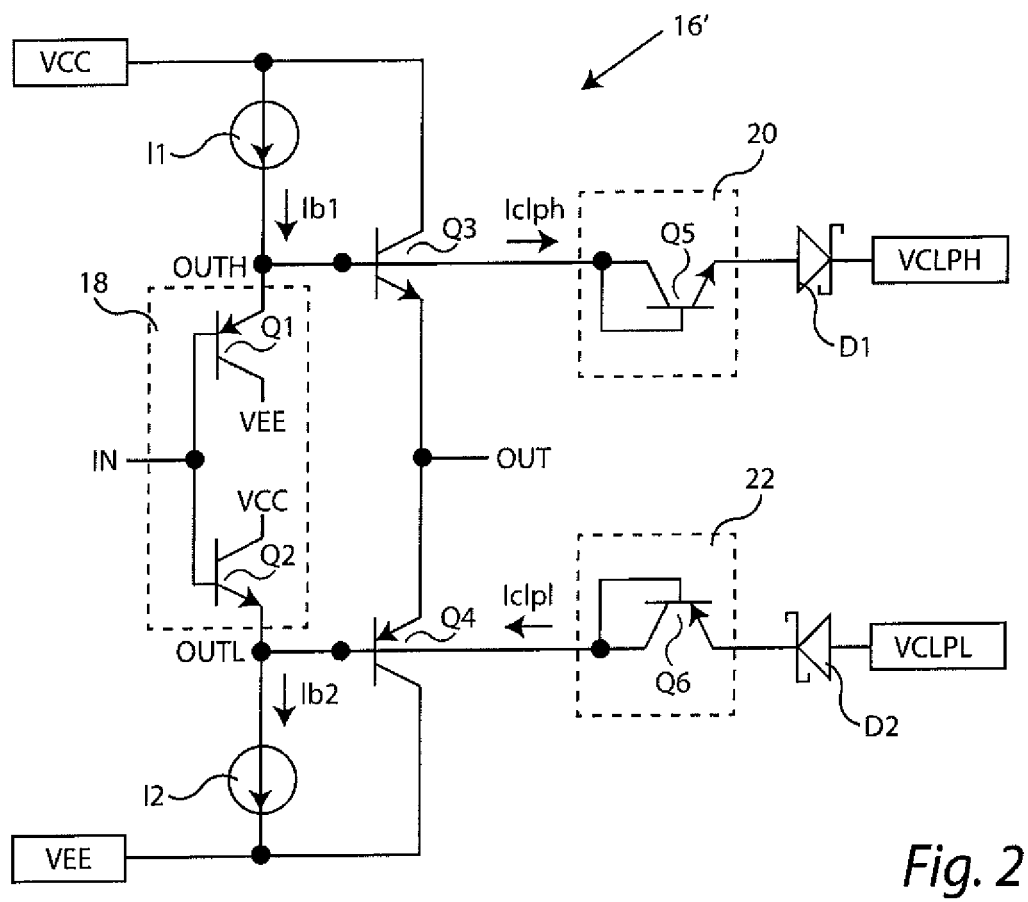
FIG. 2 is a block diagram of a first example embodiment of a voltage clamping stage.

FIG. 2 is a block diagram of an embodiment, set forth by way of example and not limitation, of a voltage clamping stage 16'. In this embodiment, the voltage clamping stage ("apparatus") 16' includes a predriver 18, current sources I1 and I2, emitter-follower transistors Q3 and Q4, level shifters 20 and 22, and low voltage-drop Schottky diodes D1 and D2. The signal input to the voltage clamping apparatus 16' is IN and the signal output of the voltage clamping apparatus is OUT.

The predriver 18 has, as an input, the input IN (signal input node) and two outputs OUTH (output high node) and OUTL (output low node). It will be appreciated by those of skill in the art that the predriver 18 can take a number of alternative configurations. However, the configuration of predriver 18 is advantageous, in some embodiments, in that it can be used as part of a "diamond-type" output stage. That is, in this non-limiting example, output stage 16' comprises a "diamond-type" output stage that combines emitter follower transistors Q3 and Q4 with transistors Q1 and Q2 of the predriver 18. The diamond-type structure employing bipolar transistors is considered to be desirable in that it is a good tradeoff between distortion, speed and current consumption. The current sources I1 and I2 provide the bias currents Ib1 and Ib2, respectively. The level shifters 20 and 22, level shifting function of the clamping process and Schottky diodes D1 and D2 provide a small diode drop, as will be discussed in greater detail subsequently.

In this non-limiting example, output stage 16' is preferably integrated with a device 12. In other example embodiments, the output stage 16' is a standalone device and/or is made from discrete components. As disclosed herein, output stage 16' is a passive or "soft" clamping solution which has a negligible impact upon its transient and alternating current (AC) performance. Furthermore, voltage clamping stage 16' does not use a feedback loop that would slow its performance and which would require stabilization circuitry.

The voltages VCLPH and VCLPL determine the output voltage swing range within full transient performance operation unaltered by the "clamping" action. If the output is driven beyond the voltage levels of V(VCLPH) or V(VCLPL), then the currents Ib1 or Ib2 will be diverted towards transistor Q5 and diode D1 or transistor Q6 and diode D2, respectively, until the output voltage reaches the clamping level for each situation.

With continuing reference to the non-limiting embodiment of FIG. 2, "high-side" clamping is accomplished as follows. As OUT voltage increases, it will reach the voltage level of VCLPH, such that V(OUT)=V(VCLPH). Therefore, VBE(Q3)=VBE(Q5)+V(D1). The result yielded by this condition shows that a Iclph current into the collector and base of transistor Q5 is a small fraction of the Ib1 current. Therefore, most of the Ib1 current is used to maintain the proper operation of the output stage without affecting the distortion performance up to the level set by V(VCLPH). If OUT is driven above VCLPH, then more of the Ib1 current is diverted to Q5 and D1 until the output voltage reaches the clamping level. In that case we have: V(OUT)=V(VCLPH)+V(D1)+VBE(Q5)−VBE(Q3)≈V(VCLPH)+V(D1), assuming VBE(Q5)≈VBE(Q3).

In a similar fashion, "low-side" clamping is accomplished as follows. As OUT voltage decreases, it will reach the voltage level of VCLPL, such that V(OUT)=V(VCLPL). Therefore, VEB(Q4)=VEB(Q6)+V(D2). The result yielded by this condition shows that a Iclpl current from the base and collector of transistor Q6 is a small fraction of the Ib2 current. Therefore, most of the Ib2 current is used to maintain the proper operation of the output stage without affecting the distortion performance down to the level set by V(VCLPL). If OUT is driven below VCLPL, then more of the Ib2 current is diverted to Q5 and D1 until the output voltage reaches the clamping level. In that case we have: V(OUT)=V(VCLPL)−V(D2)−VEB(Q6)+VEB(Q4)≈V(VCLPL)−V(D2), assuming VEB(Q6)≈VEB(Q4).

Figure 3:
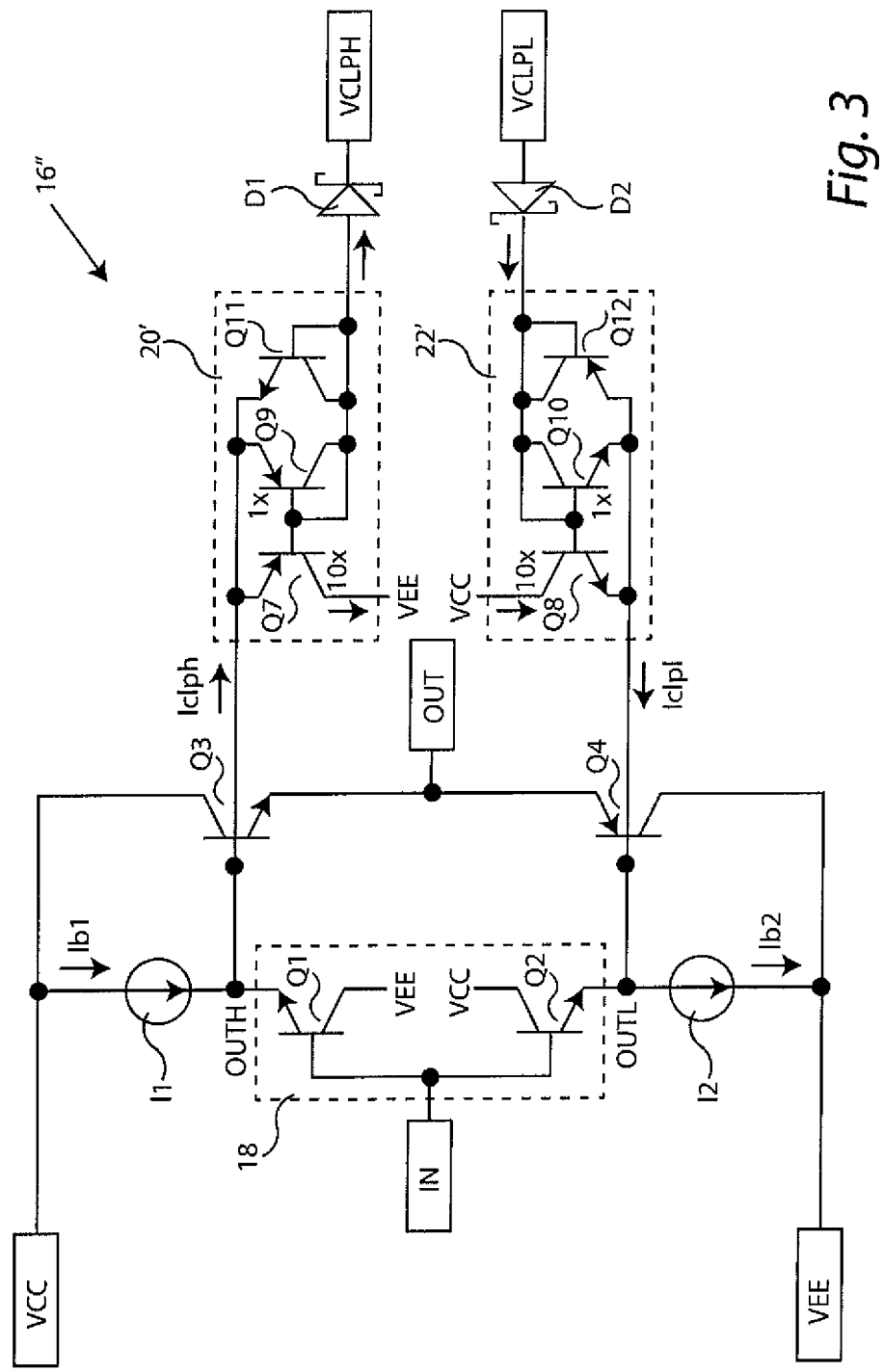
FIG. 3 is a block diagram of a second example embodiment of a voltage clamping stage.

FIG. 3 is a block diagram of an embodiment, set forth by way of example and not limitation, of a voltage clamping stage 16". In this non-limiting embodiment, output stage 16' is also a "diamond" type output stage and includes the transistors Q1, Q2, Q3 and Q4 and the current sources I1 and I2, as described previously with respect to FIG. 2, due to the use of the same predriver circuit 18. Again, as will be apparent to those of skill in the art, other predriver circuits can be used in alternate embodiments. However, in the embodiment of FIG. 3, alternate level shifters 20' and 22' are used to provide both level-shifting and current dividing functions, as will be appreciated by the discussion below.

As was the case with example output stage 16', example output stage 16" is preferably integrated with a device 12. In other example embodiments, the output stage 16" is a standalone device and/or is made from discrete components. Output stage 16" is again a passive or "soft" clamping solution which has a negligible impact upon its transient and alternating current (AC) performance. As was the case with the previous example output stage 16', voltage clamping stage 16" does not require a feedback loop that would slow performance and require stabilization.

Example output stage 16" accomplishes high-side clamping as follows. When V(OUT)≥V(VCLPH), the Ib1 current from current source I1 is diverted to a current mirror Q7|Q9 of the level shifter 20'. The V(OUT) high-side clamping level is reached when V(OUT)=VEB(Q7)−VBE(Q3)+V(D1)+V(VCLPH)≈V(D1)+V(VCLPH), assuming for simplicity that VEB(Q7)≈VBE(Q3). This circuit therefore provides a "soft" voltage clamping, since the term VEB(Q7)−VBE(Q3)+V(D1) depends on the load current I(OUT). However, when V(OUT)=V(VCLPH), there will be little current diverted towards Q7|Q9 and D1 such that the output signal can swing up to V(VCLPH) without distortion.

Example output stage 16" accomplishes low-side clamping as follows. When V(OUT)≤V(VCLPL), the Ib2 current of current source I2 is diverted to a current mirror Q8|Q10 of the level shifter 22'. The V(OUT) "low-side" clamping level is reached when V(OUT)=VEB(Q4)−VBE(Q8)−V(D2)+V(VCLPL)≈V(VCLPL)−V(D2), assuming for simplicity VEB(Q4)≈VBE(Q8). This circuit therefore also provides a "soft" voltage clamping since the term VEB(Q4)−VBE(Q8)−V(D2) depends on the load current I(OUT). However, when V(OUT)=V(VCLPL), there will be little current diverted towards Q8|Q10 and D2. It means that the output signal can swing down to V(VCLPL) without distortion.

In the non-limiting example of FIG. 3, current mirror configurations for Q7|Q9 and Q8|Q10 are employed, at least in part, for current dividing. As a result, only a fraction (e.g., $1/11^{th}$) of the Iclph current into level shifter 20' or Iclpl currents or from the level shifter 22' are flowing through diodes D1 and D2 respectively. This is advantageous in that the VCLPH and VCLPL inputs need to drive less current, and because diodes D1 and D2 can be smaller since there is less current flowing through them. Smaller size diodes have less capacitance, which further improves the AC performance of the circuit.

With continuing reference to the example embodiment of FIG. 3, it will be appreciated that each of level shifter 20' and level shifter 22' includes a plurality of bipolar transistors, including their respective current mirrors Q7/Q9 and Q8/Q10. However, it should be noted that bipolar transistors (such as PNP bipolar transistor Q9 and NPN bipolar transistor Q10) can be damaged by large reverse base-emitter voltage drops (e.g. Ve>Vb for NPN bipolar transistors and Ve<Vb for PNP bipolar transistors). Voltage limiting transistors Q11 and Q12 limit the reverse base-emitter voltage drops on Q9 and Q10 to ~0.7V when VCLPH is greater that OUT or when VCLPL is less that OUT (e.g., when the clamp is inactive), thus protecting them from damage.

It will be appreciated that an example method for voltage clamping includes drawing current from a first current source of a diamond-type output stage with a first series connection of a first level shifter and a first Schottky diode coupled to a first rail of a power supply, and drawing current from a second current source of the diamond-type output stage with a second series connection of a second level shifter and a second Schottky diode coupled to a second rail of a power supply such that an output signal from the diamond-type output stage is limited by the first rail and the second rail.

It should be noted that the foregoing examples are implemented with bipolar transistors. It will be appreciated that the example embodiments can also be implemented with transistors based upon other technologies. For example, the example embodiments can use metal oxide semiconductor field effect transistors (MOSFETs) by substituting NMOS transistors for the NPN transistors and PMOS transistors for the PNP transistors. As used herein, a "control node" of a transistor is a base in the case of a bipolar transistor and a gate in the case of a MOSFET, and an "active node" is a collector or an emitter in the case of a bipolar transistor and a source or a drain in the case of a MOSFET.

The example embodiments described above utilized diamond-type output stages, which is one type of emitter-follower stage. It should be noted that the design concepts as set forth herein are also applicable to other types of emitter-follower stages (when implemented with bipolar transistors) or source-follower stages (when implemented with MOSFET transistors). It should also be noted that, while the described embodiments are described in terms of OpAmps and ADC devices, that other devices operating at different power supply levels can also employ the techniques described herein.

It will be appreciated that, while the clamping is described as "rail-to-rail", e.g. the full range of the power supply of the device being provided the OUT signal, in certain embodiments a small offset Δ is applied to both ends of the range. For example, [VCLPL−Δ]≤OUT≤[VCLPL+Δ] has advantages in certain non-limiting embodiments. That is, in order to have smooth rail-to-rail clamping of the signal OUT, it is desirable to go a little higher than VCLPL, but not so high as to forward bias an electrostatic discharge (ESD) protection diode of the device receiving the OUT signal. In the non-limiting examples of FIGS. 2 and 3, the voltage drop of diodes D1 and D1 provide the Δ voltage levels.

In example embodiments, set forth by example and not limitation, diodes D1 and D2 are Schottky diodes. While a normal silicon diode has a voltage drop between 0.6-0.7 volts, a Schottky diode voltage drop is between about 0.15-0.45 volts, and commonly is between about 350-400 millivolts (mV) or, for the purpose of this example, 0.35 volts. Therefore, Schottky diodes are examples of low voltage-drop diodes. For a VCLPH of 3.3 volts and a VLCPL of 0.0 volts, the signal OUT will range from −0.35 volts to 3.65 volts. This will provide a smooth, linear rail-to-rail signal in the desired range of 0.0-3.3 volts without triggering the ESD protection diode which, as with most diodes, has a voltage drop of about 0.7 volts. That is, in this example, the maximum voltage of 3.65 volts of the signal OUT is less than the forward bias voltage of 3.3+0.7=4.0 volts of the ESD protection diode of the ADC.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A voltage clamping system comprising:
   a voltage clamping apparatus connected to a first power source and having a signal output node, a voltage clamp high node, and a voltage clamp low node, wherein the voltage clamp high node and the voltage clamp low node are coupled to a second power source different than the first power source; and
   an electronic device powered by the second power source and having a signal input node coupled to the signal output node of the voltage clamping apparatus;
   wherein the voltage clamping apparatus further comprises
      a predriver having a signal input node, a output high node and a output low node;
      a first current source coupled between a first voltage source node and the output high node;
      a second current source coupled between a second voltage source node and the output low node;
      a first transistor having a control node coupled to the output high node and a first active node coupled to the signal output node;
      a second transistor having a control node coupled to the output low node and a first active node coupled to the signal output node;
      a first level shifter coupling a first node of a first low voltage-drop diode to the output high node, whereby a second node of the first low voltage-drop diode comprises a voltage clamp high node; and
      a second level shifter coupling a first node of a second low voltage-drop diode to the output low node, whereby a second node of the second low voltage-drop diode comprises a voltage clamp low node.

2. A voltage clamping system as recited in claim 1 wherein the first low voltage-drop diode is a first Schottky diode and the second low voltage-drop diode is a second Schottky diode.

3. A voltage clamping system as recited in claim 1 wherein the first level shifter and the second level shifter are further configured as current dividers.

4. A voltage clamping system as recited in claim 1 wherein the first electronic device is an operational amplifier and the second electronic device is an analog-to-digital converter (ADC).

5. A voltage clamping apparatus as recited in claim 1 wherein the predriver, the first transistor, and the second transistor form a diamond-type output circuit.

6. A voltage clamping apparatus as recited in claim 1 wherein the first transistor and the second transistor are bipolar transistors.

7. A voltage clamping apparatus as recited in claim 6 wherein the first transistor is an NPN transistor and the second transistor is a PNP transistor, wherein bases of the first transistor and the second transistor are the control nodes, emitters of the first transistor and the second transistor are the first active nodes, and collectors of the first transistor and the second transistor are second active nodes coupled to the first voltage source node and the second voltage source node, respectively.

8. A voltage clamping apparatus as recited in claim 7 wherein the first low voltage-drop diode is a first Schottky diode and the second low voltage-drop diode is a second Schottky diode.

9. A voltage clamping apparatus as recited in claim 8 wherein the first node of the first Schottky diode is an anode, the second node of the first Schottky diode is a cathode, the first node of the second Schottky diode is a cathode, and the second node of the Schottky diode is an anode.

10. A voltage clamping apparatus as recited in claim 9 wherein the first level shifter comprises an NPN bipolar transistor having a base and a collector coupled to the output high node and an emitter coupled to the anode of the first Schottky diode, and wherein the second level shifter comprises a PNP bipolar transistor having a base and a collector coupled to the output low node and an emitter coupled to the cathode of the second Schottky diode.

11. A voltage clamping apparatus as recited in claim 9 wherein the first level shifter and the second level shifter are further configured as current dividers.

12. A voltage clamping apparatus as recited in claim 9 wherein the first level shifter includes a first plurality of bipolar transistors and wherein the second level shifter includes a second plurality of bipolar transistors.

13. A voltage clamping apparatus as recited in claim 12 wherein the first plurality of bipolar transistors includes a first pair of transistors configured as a first current mirror and wherein the second plurality of bipolar transistors includes a second pair of transistors configured as second current mirror.

14. A voltage clamping apparatus as recited in claim 13 wherein the first plurality of bipolar transistors further comprise a first voltage limiting transistor coupled to the anode of the first Schottky diode, and wherein the second plurality of bipolar transistors further comprise a second voltage limiting transistor coupled to the cathode of the second Schottky diode.

15. A method for voltage clamping comprising:
   drawing current from a first current source of a diamond-type output stage with a first series connection of a first level shifter and a first Schottky diode coupled to a first rail of a power supply, wherein the first level shifter is configured as a first current divider;
   drawing current from a second current source of the diamond-type output stage with a second series connection of a second level shifter and a second Schottky diode coupled to a second rail of a power supply, wherein the second level shifter is configured as a second current divider;
   whereby an output signal from the diamond-type output stage is limited by the first rail and the second rail.

16. A method for voltage clamping as recited in claim 15 wherein the first rail and the second rail are a VCC node and a VEE node, respectively, of a device having a signal input coupled to the signal output of the diamond-type output stage.

17. A method for voltage clamping as recited in claim 16 wherein drawing current from the first current source and drawing current from the second source is a passive process not requiring a feedback-loop.

* * * * *